United States Patent
Takemoto (10) Patent No.: US 10,439,522 B2
(45) Date of Patent: Oct. 8, 2019

(54) BRUSHLESS DC MOTOR, AND IDENTIFICATION METHOD AND IDENTIFICATION APPARATUS OF IDENTIFYING TYPE OF BRUSHLESS DC MOTOR

(71) Applicant: Nidec Corporation, Kyoto (JP)

(72) Inventor: Hideyuki Takemoto, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 15/966,020

(22) Filed: Apr. 30, 2018

(65) Prior Publication Data

US 2018/0316289 A1  Nov. 1, 2018

(30) Foreign Application Priority Data

May 1, 2017  (JP) .................................. 2017-091268

(51) Int. Cl.
*H02P 6/12* (2006.01)
*H02P 31/00* (2006.01)
*G01R 29/02* (2006.01)
*G01R 31/34* (2006.01)

(52) U.S. Cl.
CPC ................ *H02P 6/12* (2013.01); *H02P 31/00* (2013.01); *G01R 29/023* (2013.01); *G01R 31/343* (2013.01)

(58) Field of Classification Search
CPC ....................................................... H02P 6/12
USPC ................................ 318/400.3, 400.01, 700
See application file for complete search history.

(56) References Cited

U.S. PATENT DOCUMENTS

| 6,545,438 | B1 | 4/2003 | Mays, II |
| 7,612,508 | B2 | 11/2009 | Jreij et al. |
| 7,844,750 | B2 | 11/2010 | Pearce et al. |
| 8,378,616 | B2 * | 2/2013 | Sun .......................... H02P 5/68 318/116 |
| 8,928,270 | B2 * | 1/2015 | Sakamoto .............. G05B 11/18 318/560 |
| 9,494,927 | B2 * | 11/2016 | Matsushita ........... H02P 7/2805 |
| 2011/0320043 | A1 | 12/2011 | Mikuszewski et al. |

FOREIGN PATENT DOCUMENTS

| JP | 08-23692 A | 1/1996 |
| JP | 2003-102195 A | 4/2003 |

* cited by examiner

*Primary Examiner* — David Luo
(74) *Attorney, Agent, or Firm* — Keating & Bennett, LLP

(57) ABSTRACT

An identification method is an identification method for use in an identification apparatus that identifies types of brushless DC motors each including a circuit board on which a terminal for tachometer is mounted. The duty ratios of pulses outputted from the terminals for tachometer vary among multiple types of brushless DC motors. The identification method includes: supplying a power supply voltage from the identification apparatus to a brushless DC motor; inputting pulses outputted from the terminal for tachometer of the circuit board to the identification apparatus; obtaining the duty ratio of the pulses as a unique information piece of the brushless DC motor; and identifying the type of the brushless DC motor based on the unique information piece of the brushless DC motor.

13 Claims, 11 Drawing Sheets

| TYPE OF BRUSHLESS DC MOTOR | UNIQUE INFORMATION PIECE |
|---|---|
| 3'b001//SUPPLIER A | 4'b0010 |
| 3'b010//SUPPLIER B | 4'b0100 |
| 3'b011//SUPPLIER C | 4'b0110 |

BRUSHLESS DC MOTOR, AND IDENTIFICATION METHOD AND IDENTIFICATION APPARATUS OF IDENTIFYING TYPE OF BRUSHLESS DC MOTOR

CROSS REFERENCE TO RELATED APPLICATIONS

This application claims the benefit of priority to Japanese Patent Application No. 2017-091268 filed on May 1, 2017. The entire contents of this application are hereby incorporated herein by reference.

BACKGROUND OF THE INVENTION

1. Field of the Invention

The present disclosure relates to a brushless DC motor, and an identification method and an identification apparatus of identifying a type of brushless DC motor.

2. Description of the Related Art

A large number of electronic apparatuses are equipped with, for example, fan motors as cooling devices for releasing heat generated inside to the outside. In the electronic apparatus, the fan motor is electrically connected to a system controller, and operates under the control of the system controller.

The specification of US Laid-open Patent Publication No. 2006/0152891 discloses an identification method of allowing a system controller to acquire fan identification information through communications with a fan motor. For example, upon switching from a normal operating mode to a command mode, the fan motor and the system controller exchange commands via a power supply line, a pulse width modulation (PWM) line, and a tachometer (TACH) line. The system controller acquires the fan identification information by handshaking, and determines the compatibility of the fan motor. In this case, both of the system controller and the fan need to be equipped with complicated software for operations such as switching between the normal operating mode and the command mode.

SUMMARY OF THE INVENTION

With regard to the above conventional technique, there has been a demand for a method of more easily identifying each of types of brushless DC motors.

An embodiment of the present disclosure provides a brushless DC motor identification method and an identification apparatus that are capable of identifying types of brushless DC motors without performing handshaking in particular.

An exemplary identification method of the present disclosure is an identification method for use in an identification apparatus that identifies a type of brushless DC motor including a circuit board on which a terminal for tachometer is mounted. The duty ratios of pulses outputted from the terminals for tachometer vary among a plurality of types of brushless DC motors. The identification method includes: supplying a power supply voltage from the identification apparatus to the brushless DC motor; inputting a pulse outputted from the terminal for tachometer of the circuit board to the identification apparatus; obtaining the duty ratio of the pulse as a unique information piece of the brushless DC motor; and identifying a type of the brushless DC motor based on the unique information piece of the brushless DC motor.

An exemplary identification apparatus of the present disclosure is an identification apparatus that identifies a type of brushless DC motor including a circuit board on which a terminal for tachometer is mounted. The duty ratios of pulses outputted from the terminals for tachometer vary among a plurality of types of brushless DC motors. The identification apparatus includes: a power supply terminal to supply a power supply voltage to the brushless DC motor; an input terminal for tachometer electrically connected to the terminal for tachometer of the circuit board; and a controller that identifies the type of the brushless DC motor. The controller acquires, via the input terminal for tachometer, a pulse outputted from the terminal for tachometer of the circuit board when the power supply voltage is supplied to the brushless DC motor via the power supply terminal. The controller obtains the duty ratio of the pulse as a unique information piece of the brushless DC motor, and identifies the type of the brushless DC motor based on the unique information piece of the brushless DC motor.

An exemplary brushless DC motor of the present disclosure includes: a circuit board; a terminal for tachometer that is mounted on the circuit board; a coil; and a drive circuit that causes electricity to flow through the coil. The duty ratios of pulses outputted from the terminals for tachometer for a preset identification period after input of power supply vary among a plurality of types of brushless DC motors.

According to the exemplary embodiments of the present disclosure, multiple types of brushless DC motors are configured to output pulses at mutually different duty ratios from the terminals for tachometer. This makes it possible to provide a brushless DC motor identification method and identification apparatus that are capable of identifying types of brushless DC motors without performing handshaking in particular.

The above and other elements, features, steps, characteristics and advantages of the present discloser will become more apparent from the following detailed description of the preferred embodiments with reference to the attached drawings.

DETAILED DESCRIPTION OF THE PREFERRED EMBODIMENTS

Hereinafter, with reference to the accompanying drawings, detailed description is provided for embodiments of an identification method and an identification apparatus of identifying types of brushless DC motors according to the present disclosure. In order to prevent unnecessarily redundant description from being provided below and to facilitate the understanding by those skilled in the art, description detailed more than necessarily may be omitted for some matters. For example, detailed explanation of well-known matters and repetitive description of substantially the same configurations are omitted in some cases.

Figure 1:
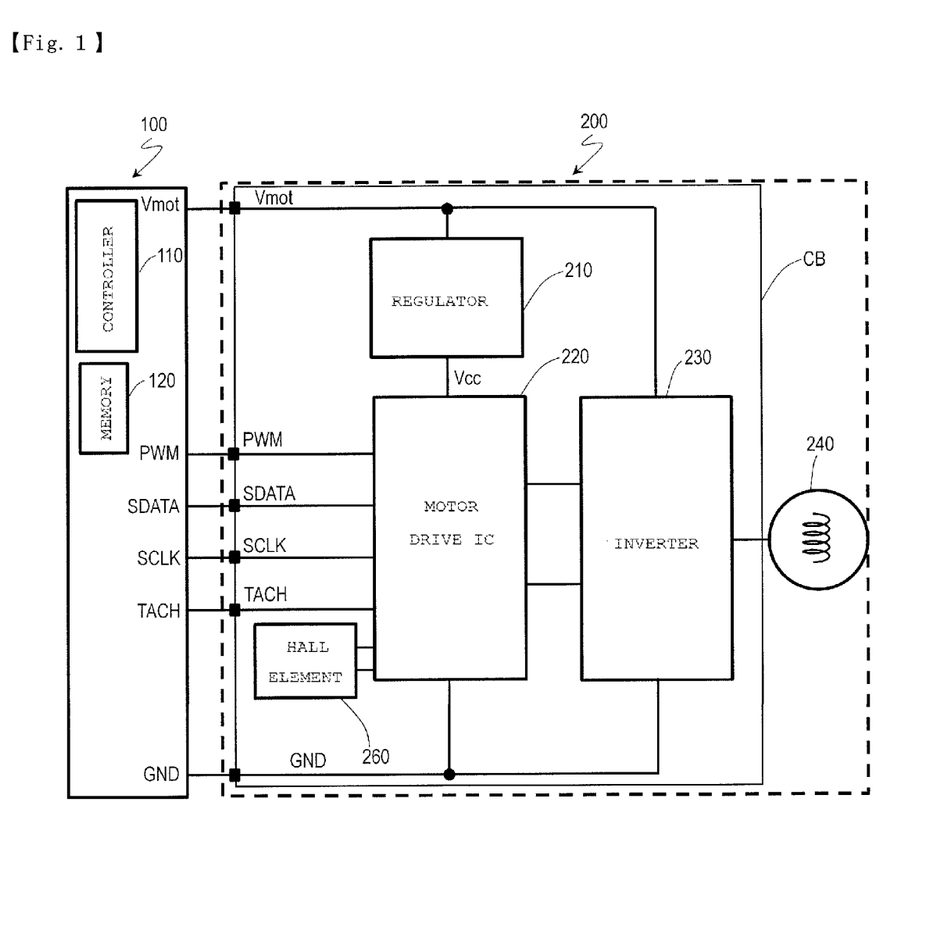
FIG. 1 is a block diagram schematically illustrating a typical block configuration example of a user system and a brushless DC motor according to exemplary Embodiment 1.

FIG. 1 schematically illustrates a typical block configuration example of a user system 100 and a brushless DC motor 200 according to Embodiment 1. In the present specification, the configuration and operations of the brushless DC motor 200 are described by taking a fan motor as an example. Brushless DC motors of the present disclosure include a motor of an inner rotor type or an outer rotor-type motor. The brushless DC motor 200 is not limited to the fan motor, but may be any of brushless DC motors for use for various purposes. The brushless DC motor 200 is, for example, a motor used for a home appliance such as an air conditioner or a washing machine, or an in-vehicle motor.

The user system 100 is electrically connected to the brushless DC motor 200. The user system 100 is capable of controlling the brushless DC motor 200. The user system 100 may be mounted on a management system for brushless DC motor manufacturing in a factory where a wide variety of motors are manufactured. Instead, the user system 100 may be a system in an electronic apparatus or be an in-vehicle system, in which the brushless DC motor 200 is installable. For example, the brushless DC motor 200 is favorably mounted in an electronic apparatus such as a main body of a desktop type personal computer or a game device. For example, when brushless DC motors 200 under different specifications are manufactured in the same location, the user system 100 is a part of a series of inspection systems. Instead, when the brushless DC motor 200 is mounted as a fan motor in a server or a main body of a desktop type personal computer, the user system 100 is the whole or a part of a system composed of various electronic components mounted on the mother board.

The user system 100 includes, for example, a controller 110 and a memory 120. The user system 100 according to the present embodiment has a function to identify types of brushless DC motors 200 as described later. In other words, the user system 100 is usable as an identification apparatus that identifies types of brushless DC motors 200. For this reason, in the present specification, the user system 100 is also referred to as an identification apparatus 100 in some cases.

The controller 110 is capable of controlling the whole of the user system 100 and the brushless DC motor 200. The controller 110 is further capable of identifying a type of the brushless DC motor 200. The controller 110 is a semiconductor integrated circuit such, for example, as a micro control unit (MCU) or a field programmable gate array (FPGA).

The memory 120 is, for example, a writable memory (for example a PROM), a rewritable memory (for example, a flash memory), or a read-only memory. The memory 120 stores a control program containing a group of commands causing the controller 110 to control the brushless DC motor 200. The memory 120 further stores a control program containing a group of commands causing the controller 110 to identify types of brushless DC motors 200. For example, these control programs are once loaded on a RAM (not illustrated) during booting. Note that the memory 120 does not have to be an external memory connected to the controller 110, but may be mounted in the controller 110. The controller 110 in which the memory 120 is mounted is, for example, an MCU mentioned above.

The user system 100 includes terminals for controlling the brushless DC motor 200, called, for example, a Vmot terminal, a PWM terminal, a TACH terminal, and a GND terminal. The user system 100 may optionally include an SDATA terminal, an SCLK terminal, a CW/CCW terminal to control the rotation direction of the motor, a START/STOP terminal to instruct the motor to start or stop rotating, and so on. In the present embodiment, the rotation of the motor means the rotation of the fan motor (or the fan).

The Vmot terminal is a terminal for a motor power supply. For example, a power supply voltage at 52 V is supplied from the Vmot terminal to the brushless DC motor 200.

The PWM terminal is an output terminal to control the number of rotations of the motor. The controller 110 generates a PWM signal to control the rotations of the motor, and outputs the PWM signal to the brushless DC motor 200 through the PWM terminal.

The TACH terminal is an input terminal for tachometer to monitor the rotational speed of the motor. The rotational speed is expressed as the number of rotations (rpm) at which the motor rotates per unit time (one minute) or the number of rotations (rps) at which the motor rotates per unit time (one second). For example, the TACH terminal of the fan motor generally outputs two pulses per rotation of the motor. In general, the duty ratio of the pulse is often set to 50%. The duty ratio is expressed by a ratio between High and Low in one pulse cycle. A pulse signal outputted according to the rotational speed of the motor from the TACH terminal of the brushless DC motor 200 is inputted to a TACH terminal of the user system 100.

The SDATA terminal and the SCLK terminal are input/output terminals for performing I2C communications. The SDATA terminal and the SCLK terminal are not indispensable terminals. The user system 100 and the brushless DC motor 200 are enabled to perform serial communications therebetween through the SDATA terminals and the SCLK terminals.

The brushless DC motor 200 is, for example, a DC fan including an impeller. The brushless DC motor 200 is, for example, an axial fan, a centrifugal fan, a cross-flow fan, or a sirocco fan. The brushless DC motor 200 typically includes a regulator 210, a motor drive IC 220, an inverter 230, a circuit board CB on which these electronic components are mounted, a coil 240, and a Hall element 260. For example, the regulator 210, the motor drive IC 220, and the inverter 230 constitute a drive circuit that drives the motor by causing electricity to flow through the coil 240.

The regulator 210 lowers the motor power supply voltage at 52 V, for example, to generate a power supply voltage Vcc (for example, 5 V) for the motor drive IC 220. Here, the regulator 210 is not indispensable. Instead, for example, in addition to a motor power supply voltage Vmot, a power supply voltage Vcc may be supplied from the user system 100 to the brushless DC motor 200 as described later.

The motor drive IC 220 is connected to the inverter 230. The motor drive IC 220 generates a control signal to control the inverter 230, in accordance with the PWM signal transmitted from the user system 100. The motor drive IC 220 includes an SDATA terminal and an SCLK terminal, and is capable of performing I2C communications with the user system 100.

The motor drive IC 220 monitors the rotational speed of the motor based on outputs from the Hall element 260, and generates a pulse signal according to the rotational speed of the motor, for example. The output method is, for example, to output two pulses per rotation, and the duty ratio of the pulse is, for example, 50%. In this connection, a technique of generating a TACH signal without using a Hall element has been known. In the case of using such a technique, the Hall element 260 is not needed.

The inverter 230 is electrically connected to the motor drive IC 220 and the coil 240 of the motor. The inverter 230 converts the power of the motor power supply to the power to be supplied to the fan motor, and causes the obtained power to flow into the coil 240.

The coil 240 is a winding of the motor.

The brushless DC motor 200 includes a circuit board CB on which, for example, a Vmot terminal, a PWM terminal, an SDATA terminal, an SCLK terminal, a TACH terminal, and a GND terminal respectively corresponding to the terminals of the user system 100 are mounted.

In the brushless DC motor 200, the PWM terminal is an input terminal to control the number of rotations of the motor, whereas the TACH terminal is an output terminal for tachometer.

Figure 2:
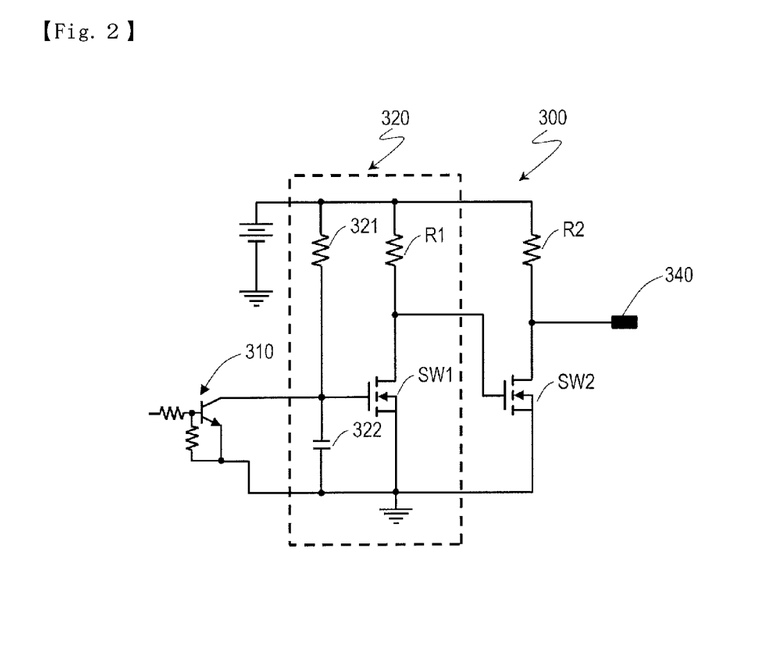
FIG. 2 is a circuit diagram illustrating a circuit configuration of a TACH terminal of the brushless DC motor.

FIG. 2 schematically illustrates a circuit configuration of the TACH terminal 300 of the brushless DC motor 200.

A TACH terminal (not illustrated) of the user system 100 is an input terminal, and typically includes a pull-up resistance.

The TACH terminal 300 of the brushless DC motor 200 is an output terminal. The TACH terminal 300 amplifies outputs from the Hall element 260 on the circuit board CB, and outputs the amplified outputs to the outside via a pin 340. For example, the TACH terminal 300 includes: a switching element 310 with an open-collector or open-drain output function; an RC filter circuit 320 including a capacitor, the capacities of which vary among multiple types of brushless DC motors; a resistor R2; and a switching element SW2. The RC filter circuit 320 includes a resistor 321 and a capacitor 322 connected in series, and includes a resistor R1 and a switching element SW1. Thus, the RC filter circuit 320 is electrically connected to an open terminal (collector or drain terminal) of the switching element 310.

The switching element 310 amplifies the outputs from the Hall element 260. The amplified signal is outputted through the RC filter circuit 320 to the outside from the pin 340. For example, the resistance values of the resistors 321, R1, and R2 are in the order of dozen kΩ, and are, for example, 10 kΩ.

Figure 3:
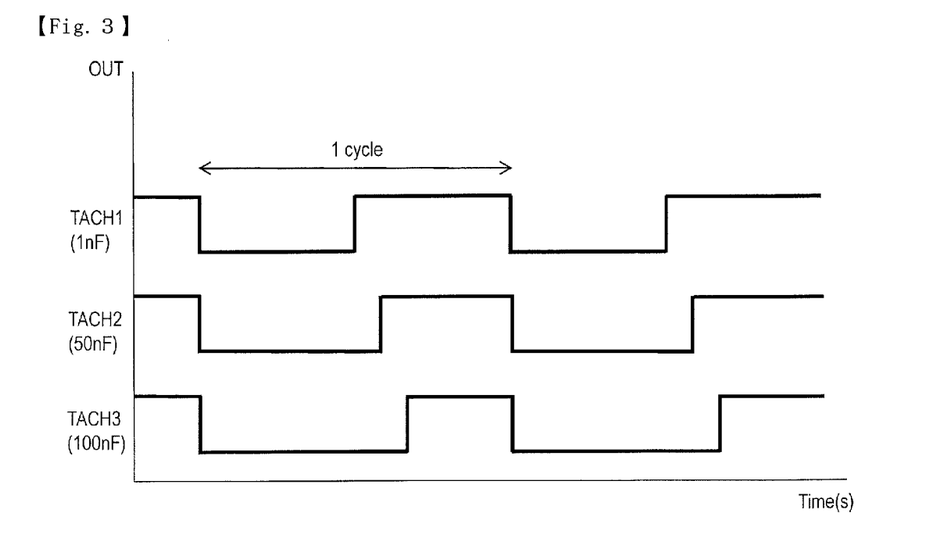
FIG. 3 is a graph illustrating pulse waveforms outputted from the TACH terminal in the case where the capacity of a capacitor is set to 1 nF, 50 nF, and 100 nF.

A duty ratio of the TACH pulse signal outputted from the pin 340 can be adjusted by changing the capacity of the capacitor 322 of the RC filter circuit 320. FIG. 3 illustrates pulse waveforms outputted from the TACH terminal 300 in the case where the capacity of the capacitor 322 is set to 1 nF, 50 nF, and 100 nF when one cycle is, for example, 10 ms. The horizontal axis indicates a time (second) and the vertical axis indicates a pulse signal outputted from the TACH terminal 300.

When the capacity of the capacitor 322 is set to 1 nF, for example, the TACH terminal 300 outputs a pulse signal with a duty ratio of 50%. When the capacity of the capacitor 322 is set to 50 nF, for example, the TACH terminal 300 outputs a pulse signal with a duty ratio of 40%. When the capacity of the capacitor 322 is set to 100 nF, for example, the TACH terminal 300 outputs a pulse signal with a duty ratio of 30%.

In other words, rise time of a waveform can be delayed by an RC filter formed of the resistor 321 and the capacitor 322. Irrespective of the number of rotations of the motor or the actual lengths of the on-time and the off-time in one pulse cycle, this RC filter elongates the on-time by a certain time length, while shortening the off-time by the certain time length. For this reason, a difference in the number of rotations of the motor brings about a difference in the duty ratio in one pulse.

For example, in the case where the brushless DC motor 200 employing an output method of outputting one pulse per rotation is rotated at 600 rpm, the off-time is 60 ms and the on-time is 40 ms. In contrast, when the brushless DC motor 200 is rotated at 60 rpm, the off-time is 510 ms and the on-time is 490 ms. A time difference between the on-time and the off-time in one pulse cycle is 20 ms in either case.

In this way, the duty ratio can be varied with a change in the capacity of the capacitor 322 in the RC filter circuit 320. As other methods of varying the duty ratio, there are, for example, a method using an RL filter circuit, a method using an MCU, and so on. The method using the aforementioned RC filter circuit is preferable from the viewpoint of the product costs.

In another example, the RC filter circuit 320 is electrically connected between the switching element 310 and the output terminal of the Hall element 260. With this configuration, an output from the Hall element 260 first passes through the RC filter circuit 320, by which the rise time of the waveform can be delayed. The switching element 310 can amplify the pulse signal with the rise time delayed. Eventually, the pin 340 of the TACH terminal 300 outputs a TACH signal with the same waveform as any of the waveforms illustrated in FIG. 3, for example. In addition, an output from the RC filter circuit 320 can be used as, for example, a signal for switching excitation phases besides the TACH signal.

The duty ratios of the pulse signals outputted from the TACH terminals 300 vary among multiple types of brushless DC motors. For example, a certain pulse duty ratio may be exclusively allocated to each of suppliers that manufacture brushless DC motors 200. For example, it is possible to allocate a duty ratio of 50% to a supplier A, allocate a duty ratio of 40% to a supplier B, allocate a duty ratio of 30% to a supplier C. Moreover, it is possible to allocate duty ratios different from the above duty ratios to multiple suppliers, respectively.

As another example, a certain pulse duty ratio may be exclusively allocated to each product lot. For example, it is possible to allocate a duty ratio of 50% to a product lot number A, allocate a duty ratio of 40% to a product lot number B, allocate a duty ratio of 30% to a product lot number C. Moreover, it is possible to allocate duty ratios different from the above duty ratios to multiple product lot numbers, respectively. In this way, the number of multiple types of brushless DC motors existing is equal to the number of suppliers or the number of product lots to be managed, for example.

In the present disclosure, the different duty ratios of pulses outputted from the TACH terminals 300 only have to be used at least in a mode of identifying types of the brushless DC motors 200. For this reason, in a normal operating mode other than the mode of identifying the types of the brushless DC motors 200, the brushless DC motors 200 of multiple suppliers may output pulses at a common duty ratio along with rotations of the motor. The common duty ratio is, for example, 50%.

Figure 4:
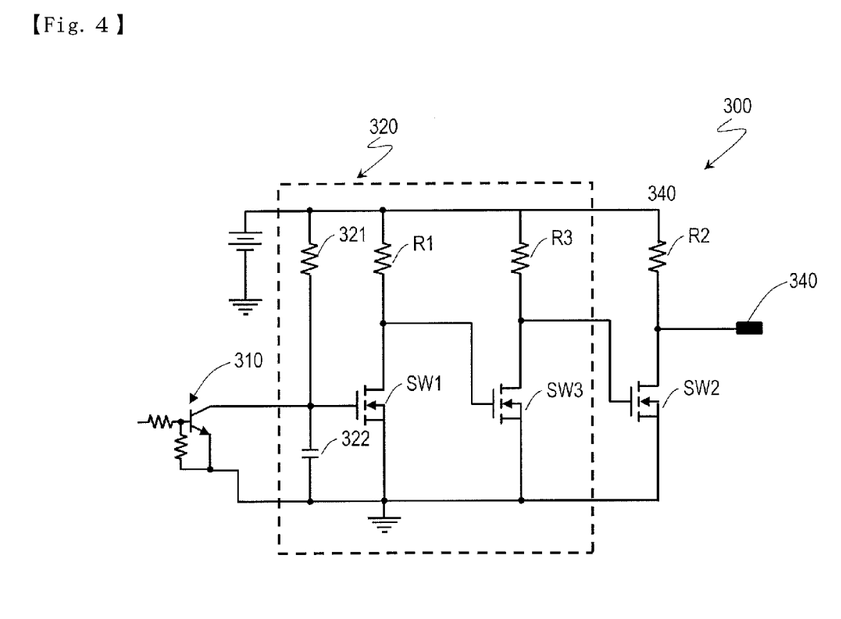
FIG. 4 is a circuit diagram illustrating another circuit configuration of a TACH terminal of the brushless DC motor.
Figure 5:
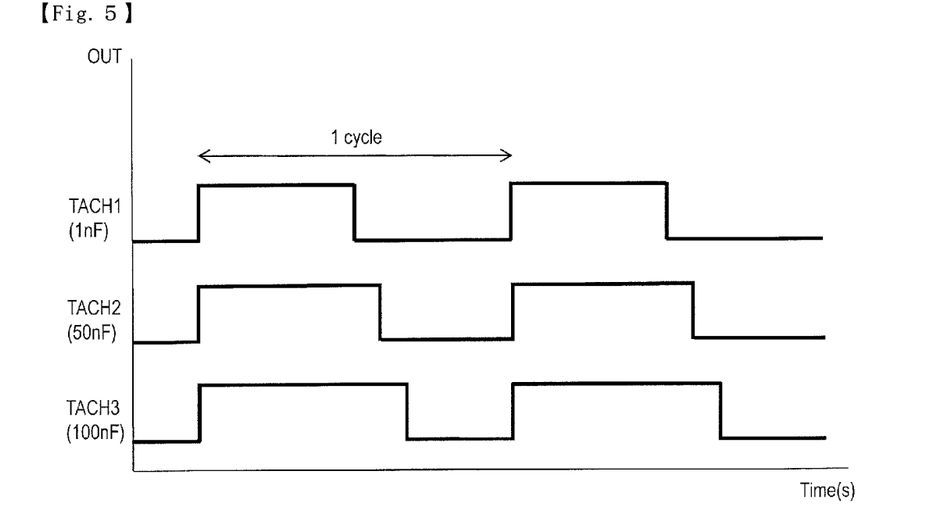
FIG. 5 is a graph illustrating pulse waveforms outputted from the TACH terminal in the case where the capacity of a capacitor is set to 1 nF, 50 nF, and 100 nF.

FIG. 4 schematically illustrates a circuit configuration of the TACH terminal 300 of the brushless DC motor 200. FIG. 5 illustrates pulse waveforms outputted from the TACH terminal 300 in the case where the capacity of the capacitor 322 is set to 1 nF, 50 nF, and 100 nF when one cycle is, for example, 10 ms.

The phase of the TACH signal can be inverted when a resistor R3 and a switching element SW3 are inserted into an RC filter circuit 320 as illustrated in FIG. 4. For example, the pulse with the duty ratio of 40% illustrated in FIG. 3 can be changed to a pulse with a duty ratio of 60% and the pulse with the duty ratio of 30% illustrated in FIG. 3 can be changed to a pulse with a duty ratio of 70%.

Figure 6:
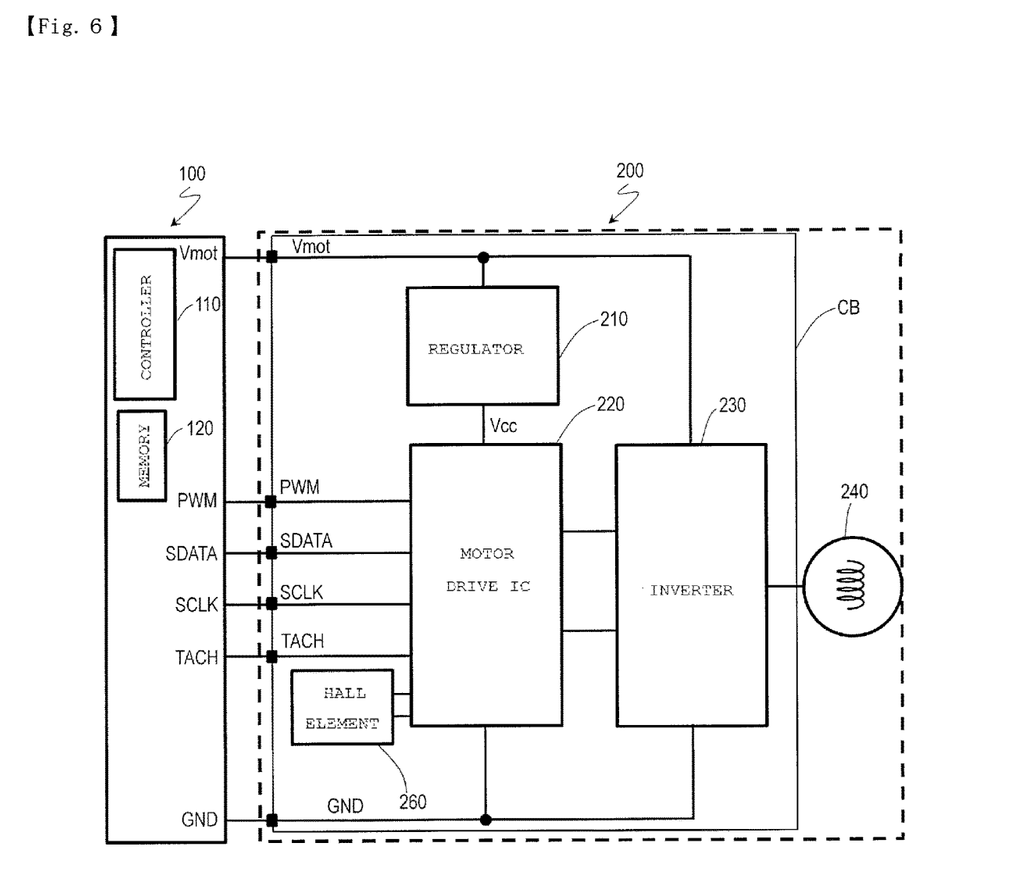
FIG. 6 is a block diagram schematically illustrating another block configuration example of the user system and the brushless DC motor according to exemplary Embodiment 1.

FIG. 6 schematically illustrates another block configuration example of the user system 100 and the brushless DC motor 200.

The user system 100 may further include, for example, multiple light emitted diodes (LED) 130 as light emitters. The multiple LEDs 130 constitute a notification device that provides a notification of an identification result of the type of brushless DC motor 200. For example, the number of LEDs 130 provided may be equal to the number of types of brushless DC motors. If there are two types of brushless DC motors of the suppliers A and B, for example, two LEDs having emitted light of different colors, for example, may be provided. For example, it is possible to use a red LED for the supplier A, and a blue LED for the supplier B.

The brushless DC motor 200 may include an MCU 250. Equipped with the MCU 250, the brushless DC motor 200 can be made intelligent. For example, the MCU 250 enables direct control of the motor drive IC 220. In addition, as described above, the brushless DC motor 200 does not have to include the regulator 210. In this case, for example, the power supply voltage Vcc for the motor drive IC 220 is supplied from the user system 100.

Figure 7:
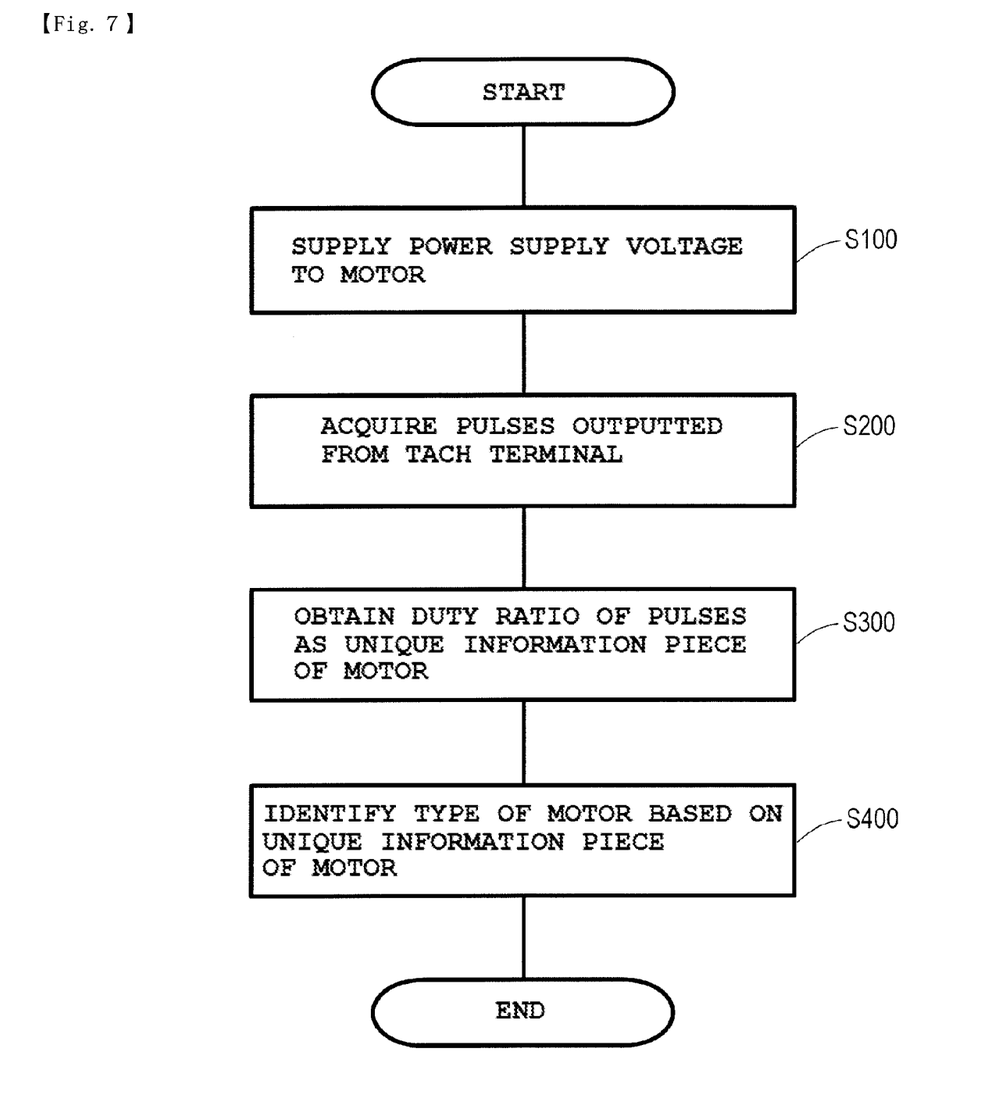
FIG. 7 is a flowchart illustrating an identification method of identifying a type of brushless DC motor according to exemplary Embodiment 1.

FIG. 7 illustrates a flowchart of an identification method of identifying a type of brushless DC motor.

The identification method according to the present embodiment is, for example, a method used in the identification apparatus 100. In general, each of processes of manufacturing a wide variety of products equipped with motors requires identification of types of brushless DC motors 200 in order to prevent different types of motors from being included into the process. For example, the identification method of the present disclosure is advantageously applied to a method of inspecting the compatibility of a brushless DC motor 200 with the user system 100 during product manufacturing in a factory. For example, the process of inspecting the compatibility of a brushless DC motor 200 is one of product manufacturing processes.

(Step S100) First, in the state where the terminals of the identification apparatus 100 (user system 100) and the brushless DC motor 200 are electrically connected to each other, the identification apparatus 100 supplies a motor power supply voltage Vmot to the brushless DC motor 200. Instead, in the configuration example illustrated in FIG. 6, the identification apparatus 100 may supply the brushless DC motor 200 with a power supply voltage Vcc for the motor drive IC 220 together with the motor power supply voltage Vmot. For example, upon input of the power supply, the electronic components in the brushless DC motor 200 perform an initialization operation such as a reset operation. After the completion of the initialization operation, the regulator 210, the motor drive IC 220, and the inverter 230 are supplied with the stable power supply voltages.

The pull-up resistance in the TACH terminal of the identification apparatus 100 is pulled up at a pull-up voltage, and the pull-up voltage is supplied to the TACH signal line via the pull-up resistance. With this, in the TACH terminal 300 of the brushless DC motor 200, the TACH signal line is kept at a high voltage level while the switching element 310 (see FIG. 2) is off.

(Step S200) The pulse signal outputted from TACH terminal 300 is inputted to the identification apparatus 100. When the switching element 310 is turned on and off, the pulse signal is generated and outputted from the pin 340 of the TACH terminal 300 in the brushless DC motor 200. Unless the switching element 310 in the TACH terminal 300 is turned on, the brushless DC motor 200 does not output the pulse signal from the TACH terminal 300.

For example, the switching element 310 can be turned on and off by an operation of rotating the brushless DC motor 200 at an instructed rotational speed. To be more specific, the identification apparatus 100 (mainly the controller 110) gives a rotation control signal to the brushless DC motor 200 via the PWM terminal, and thereby rotates the brushless DC motor 200 at the instructed rotational speed. The instructed rotational speed is, for example, 600 rpm. In this case, one pulse period is 100 ms. With the rotations of the brushless DC motor 200, the switching element 310 is turned on and off and the pulse signal is outputted from the TACH terminal 300 according to the instructed rotational speed. The identification apparatus 100 can acquire the pulse signal outputted from the TACH terminal 300.

In the case of using the RC filter circuit 320 illustrated in FIG. 2, for example, the duty ratio of the pulse varies depending on the rotational speed of the motor as described above. For this reason, in the present embodiment, the brushless DC motor 200 is rotated at the instructed rotational speed, for example, 600 rpm.

In another example, the pulse signal may be obtained from the TACH terminal 300 by directly controlling the on and off of the switching element 310 without rotating the brushless DC motor 200. For example, an identification period for identifying a type of brushless DC motor 200 is provided after the start of supply of the power supply voltage to the brushless DC motor 200. For the identification period, the MCU 250 (see FIG. 6) generates a pulse signal at the allocated duty ratio among predetermined duty ratios allocated to the respective types of brushless DC motors, and forcedly gives the signal to the switching element 310. In other words, the MCU 250 can generate a dummy signal that is the same as the pulse signal generated with the rotations of the brushless DC motor 200, and forcedly give the signal to the switching element 310.

As the predetermined duty ratio, for example, it is possible to allocate a duty ratio of 50% to the brushless DC motor 200 of the supplier A, allocate a duty ratio of 40% to the brushless DC motor 200 of the supplier B, and allocate a duty ratio of 30% to the brushless DC motor 200 of the supplier C. Then, the identification period may be set, for example, in the order of several seconds. the multiple types of brushless DC motors 200 output pulse signals different in the duty ratio from the TACH terminals 300. The identification apparatus 100 can acquire the pulse signals outputted from the TACH terminals 300.

(Step S300) The identification apparatus 100 obtains the duty ratio of the acquired pulse signal as a unique information piece of the brushless DC motor 200. The identification apparatus 100 may obtain the duty ratio of 50% as the unique information piece of the brushless DC motor 200 of the supplier A. As similar to this, the identification apparatus 100 may obtain the duty ratio of 40% as the unique information piece of the brushless DC motor 200 of the supplier B. The identification apparatus 100 may obtain the duty ratio of 30% as the unique information piece of the brushless DC motor 200 of the supplier C.

In another example, the identification apparatus 100 may obtain, as a unique information piece of the brushless DC motor, a time difference between the on-time and the off-time in one pulse cycle in the pulse signal outputted from the TACH terminal 300. As described above, in the case of using the RC filter circuit 320, a time difference between the on-time and the off-time in one pulse cycle takes a constant value irrespective of the rotational speed of the motor. In this case, the brushless DC motor 200 does not have to be rotated at the instructed fixed rotational speed (for example, 600 rpm). For example, one group and another group of brushless DC motors 200 of the supplier A may be rotated at 600 rpm and 60 rpm, respectively.

(Step S400) The identification apparatus 100 identifies the type of brushless DC motor 200 based on the obtained unique information piece of the brushless DC motor 200. For example, the controller 110 of the identification apparatus 100 can refer to a table to identify the type of brushless DC motor 200 to be identified based on the obtained unique information piece.

Figure 8:
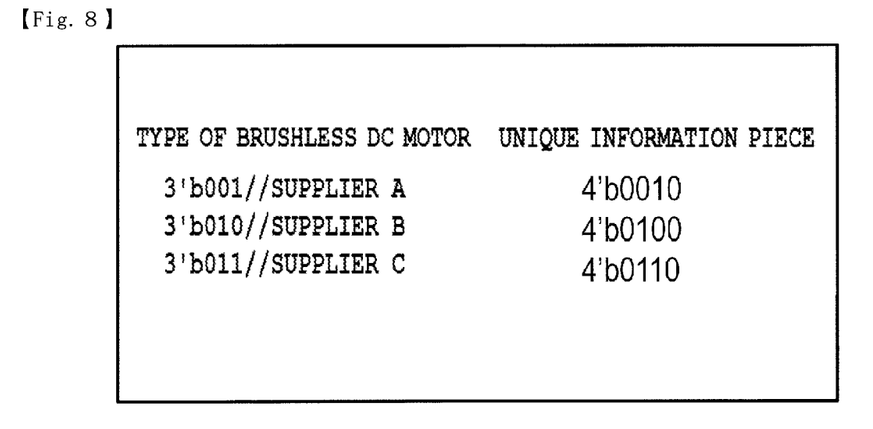
FIG. 8 is a schematic diagram illustrating contents in a table used for identification.

FIG. 8 illustrates contents in a table used for identification. The table is a lookup table (LUT) in which multiple types of brushless DC motors are associated with multiple unique information pieces of brushless DC motors. The table is stored in the memory 120, for example. As described above, the multiple types of brushless DC motors are present for the respective suppliers, for example, and there are three types of the suppliers A, B and C, for example.

Each of types of brushless DC motors is expressed with a 3-bit binary. For example, it is possible to allocate "001" to the supplier A, allocate "010" to the supplier B, and allocate "011" to the supplier C. The unique information piece of the brushless DC motor 200 is expressed with a 4-bit binary, for example. For example, it is possible to use "0101" to express the unique information piece of the supplier A that outputs a pulse signal at a duty ratio of 50%, use "0100" to express the unique information piece of the supplier B that outputs a pulse signal at a duty ratio of 40%, and use "0011" to express the unique information piece of the supplier C that outputs a pulse signal at a duty ratio of 30%.

For example, when the identification apparatus 100 obtains a unique information piece of "0101" in step 300, the identification apparatus 100 can recognize the brushless DC motor 200 as a motor manufactured by the supplier A by referring to that table. For example, when the identification apparatus 100 obtains a unique information piece of "0011" in step 300, the identification apparatus 100 can recognize the brushless DC motor 200 as a motor manufactured by the supplier C. The identification apparatus 100 can identify, for example, about four types of brushless DC motors 200 by referring to that table.

Figure 9:
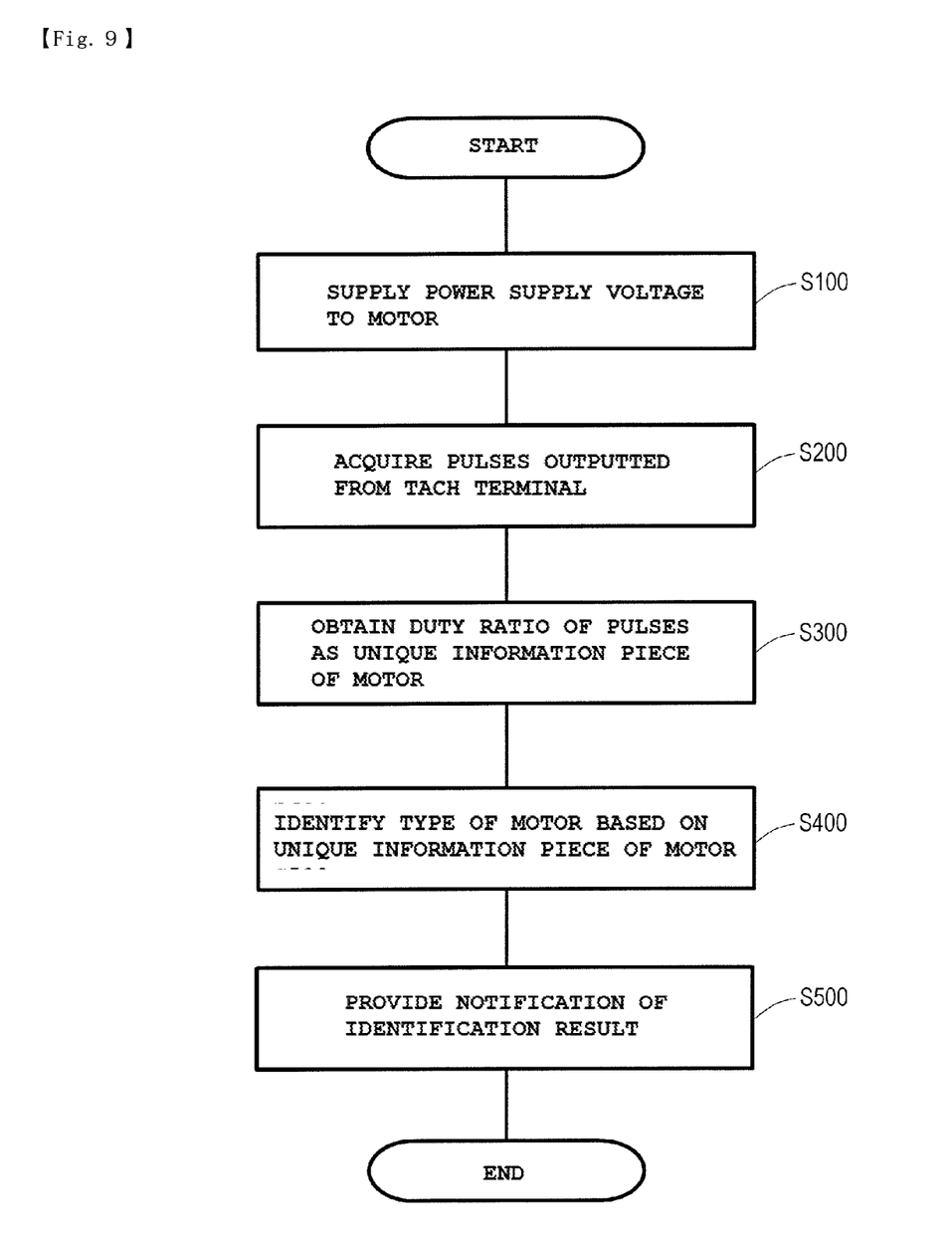
FIG. 9 is a flowchart illustrating another specific example of the identification method of identifying a type of brushless DC motor.

FIG. 9 illustrates another specific example of a flowchart of the identification method of identifying a type of brushless DC motor 200.

As illustrated in FIG. 9, the identification method according to the present embodiment may further include a step of providing a notification of an identification result of the type of brushless DC motor 200 (S500).

As one example of a notification method, the multiple light emitters illustrated in FIG. 6, for example, the multiple LEDs 130 may be used to provide a notification of an identification result of the type of brushless DC motor 200. Based on the identification result of the type of brushless DC motor 200, the controller 110 of the identification apparatus 100 selects the LED 130 allocated to the brushless DC motor 200 to be identified from among the multiple LEDs 130 allocated to the respective types of brushless DC motors, and causes the selected LED 130 to emit light. Incidentally, the light emitter is not limited to an LED, but may be any element capable of providing a notification by using light.

For example, a red LED may be allocated for the supplier A, a blue LED may be allocated for the supplier B, and a green LED may be allocated for the supplier C. When identifying the brushless DC motor of the supplier C, the controller 110 of the identification apparatus 100 can cause the green LED to emit light. With this, an operator in a factory, for example, can visually recognize whether or not the brushless DC motor to be identified is the motor of the supplier C.

As another example, a display device (for example, a liquid crystal display), a speaker, or the like may be used to provide a notification of an identification result of the type of brushless DC motor 200. For example, the identification result may be displayed as text information on the liquid crystal display. For example, the speaker may make a sound from among sounds different in pitch among the types of brushless DC motors.

As another example, the controller 110 of the identification apparatus 100 may once write the identification result to the memory 120, or transmit the identification result to another apparatus or device that needs the identification result. These modes are also examples of the identification result notification.

According to the present embodiment, when brushless DC motors 200 are powered on, for example, the brushless DC motors 200 automatically output pulse signals at respectively different duty ratios from the TACH terminals. The identification apparatus 100 only has to receive the outputted pulse signals. In addition, the method can use the existing TACH terminal and does not need new provision of a terminal dedicated to the identification. This minimizes changes in the specifications of the drive circuits of the motors. Moreover, only by rewriting firmware installed in the identification apparatus 100, for example, the identification apparatus 100 is enabled to identify types of brushless DC motors 200. A decrease in the number of components can result in a decrease in product costs. There is no need to perform the conventionally necessary operations such as communications by handshaking between the identification apparatus 100 and the brushless DC motors 200, and a mode switching in the brushless DC motors 200.

The identification method of the present disclosure may be also advantageously used not only in product manufacturing processes but also in other processes such, for example, as one to replace a brushless DC motor having a failure with a new one. It is possible to confirm whether the new brushless DC motor after the replacement is compatible with the system or not. Moreover, for example, products equipped with brushless DC motors are connected to the Internet. In this case, what is termed Internet of Things (IoT) is established. For example, each of the suppliers of the products equipped with brushless DC motors can identify the product equipped with a particular brushless DC motor by analyzing big data including the unique information pieces of brushless DC motors. This enables quality stabilization by preventing the occurrence of a trouble or doing the like.

Figure 10:
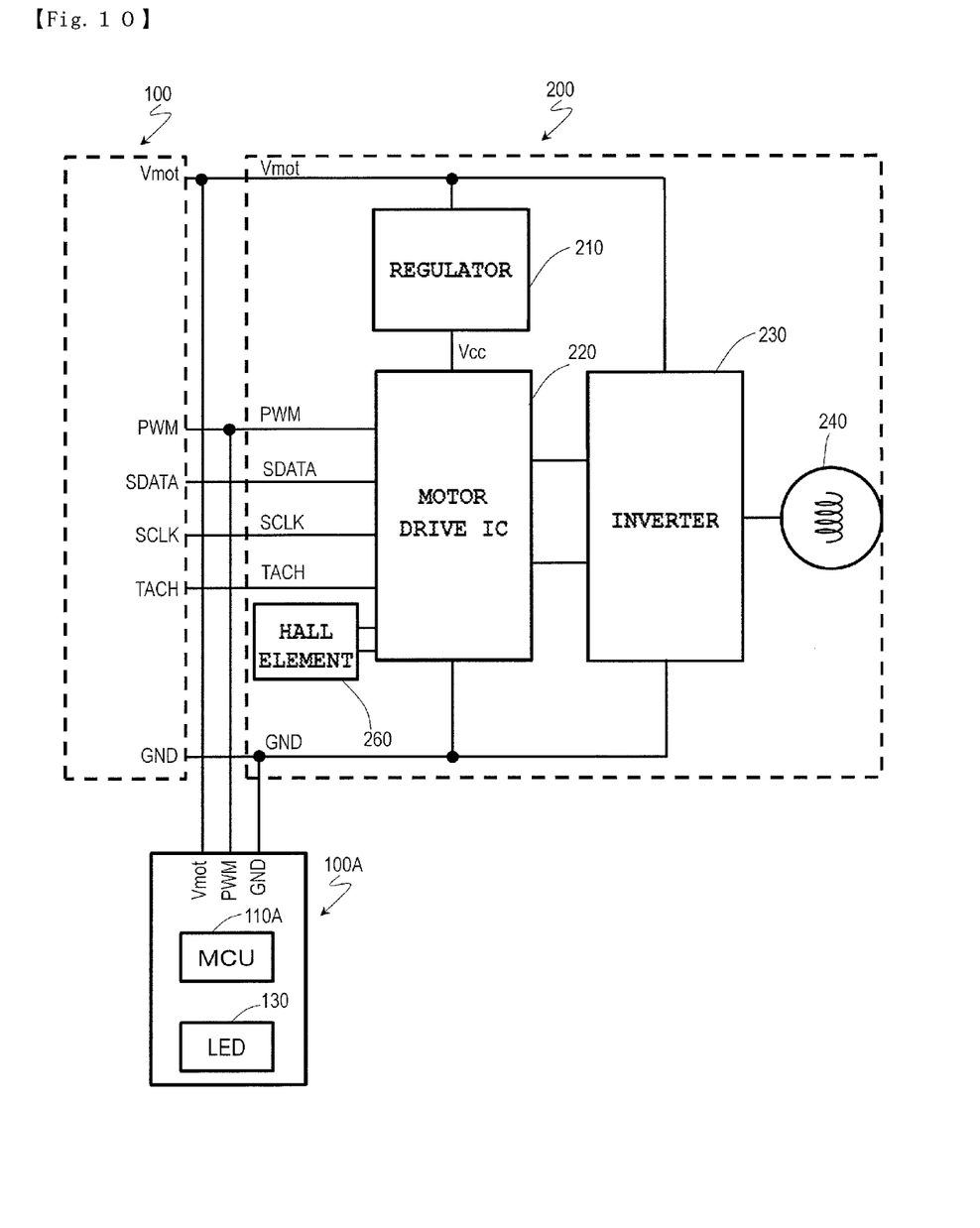
FIG. 10 is a block diagram schematically illustrating a typical block configuration example of a user system, an identification apparatus, and a brushless DC motor according to exemplary Embodiment 2.

FIG. 10 schematically illustrates a typical block configuration example of a user system 100, an identification apparatus 100A, and a brushless DC motor 200 according to Embodiment 2.

The identification apparatus 100A according to the present embodiment is an apparatus separated from the user system 100 unlike Embodiment 1. The identification apparatus 100A includes, for example, an MCU 110A and an LED 130. The identification apparatus 100A includes, for example, a Vmot terminal, a GND terminal, and a TACH terminal as terminals necessary for identifying types of brushless DC motors 200. The identification apparatus 100A may further include a PWM terminal.

The user system 100, the identification apparatus 100A, and the brushless DC motor 200 are electrically connected to each other via the Vmot terminals, the GND terminals, and the TACH terminals. Thus, any one of the user system 100 and the identification apparatus 100A can supply a power supply voltage to the brushless DC motor 200 via the Vmot terminals. A PWM signal can be transmitted from the user system 100 to the brushless DC motor 200.

The identification apparatus 100A may further include the PWM terminal. In place of the user system 100, the MCU 110A of the identification apparatus 100A may generate a PWM signal for causing the brushless DC motor 200 to rotate and provide the PWM signal to the brushless DC motor 200.

Upon input of power supply, a pulse signal outputted from the TACH terminal 300 is inputted to the TACH terminal of the identification apparatus 100A. For example, the MCU 110A can identify the type of brushless DC motor 200 based on the duty ratio of pulses in the acquired pulse signal in accordance with the processing flow illustrated in FIG. 7. Moreover, the MCU 110A may transmit the identification result to the controller 110 of the user system 100.

Figure 11:
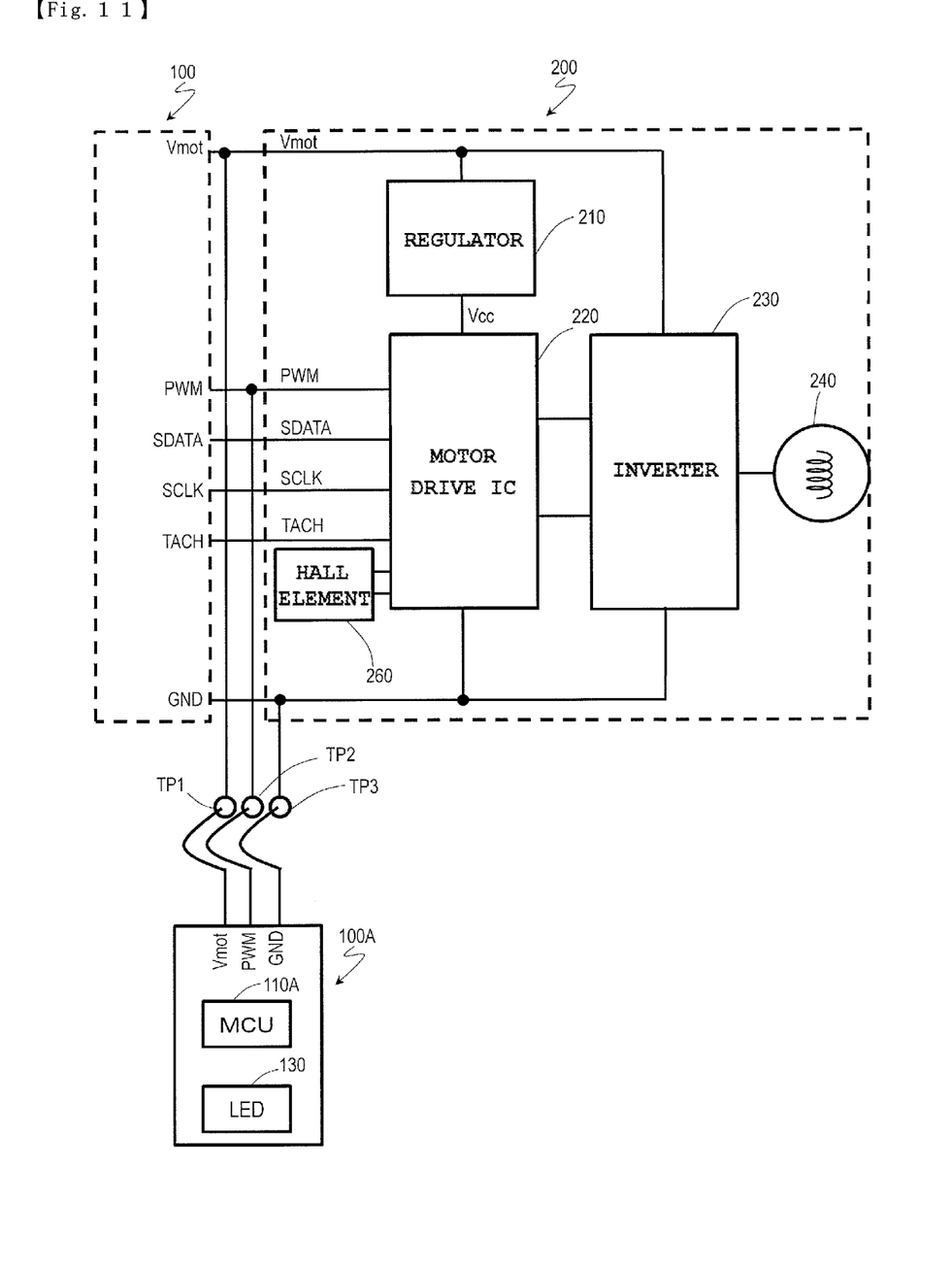
FIG. 11 is a block diagram schematically illustrating another block configuration example of the user system, the identification apparatus, and the brushless DC motor according to exemplary Embodiment 2.

FIG. 11 schematically illustrates another block configuration example of the user system 100, the identification apparatus 100A, and the brushless DC motor 200.

The identification apparatus 100A is electrically connected to the user system 100 and the brushless DC motor 200 via, for example, test points (TP). TP1 is a TP for motor power supply. TP2 is a TP for TACH signal. TP3 is a TP for GND. A special-purpose probe is connected to the identification apparatus 100A, and a type of brushless DC motor 200 can be identified by bringing the probe into contact with the TPs.

General description of an embodiment of the present disclosure is provided below.

An identification method according to an exemplary embodiment of the present disclosure is an identification method for use in, for example, an identification apparatus 100 that identifies types of brushless DC motors 200, for example, as described with reference to FIGS. 1 and 2. Each brushless DC motor 200 includes a circuit board CB on which a TACH terminal 300 for tachometer is mounted. The duty ratios of pulses outputted from the TACH terminals 300 vary among multiple types of brushless DC motors. As described with reference to FIG. 7, for example, the identification method for the brushless DC motor 200 includes: supplying a power supply voltage Vmot from the identification apparatus 100 to the brushless DC motor 200; inputting pulses outputted from the TACH terminal 300 of the circuit board CB to the identification apparatus 100; obtaining the duty ratio of the pulses as a unique information piece of the brushless DC motor 200; and identifying a type of the brushless DC motor 200 based on the unique information piece of the brushless DC motor 200.

According to the identification method as described above, each of multiple types of brushless DC motors 200 is configured to output pulses at an exclusively allocated duty ratio from the TACH terminal 300, and this exclusive allocation enables identification of suppliers, products, or production lots.

In an embodiment, as described above, the circuit board CB further includes a PWM terminal to control the number of rotations of the brushless DC motor 200. The identification method for the brushless DC motor 200 further includes giving a rotation control signal to the brushless DC motor 200 from the identification apparatus 100 via the PWM terminal, thereby rotating the brushless DC motor 200 at an instructed rotational speed, and the obtaining a unique information piece of the brushless DC motor 200 includes obtaining the duty ratio of pulses outputted according to the instructed rotational speed from the TACH terminal 300 of the circuit board CB with rotations of the brushless DC motor 200.

According to the identification method as described above, it is possible to acquire the pulses outputted from the TACH terminal 300 according to the rotational speed of the brushless DC motor 200.

In an embodiment, as described above, the TACH terminal 300 of the circuit board CB includes an RC filter circuit 320 provided with a capacitor 322. Here, the capacities of the capacitors 322 vary among multiple types of brushless DC motors.

According to the identification method as described above, it is possible to adjust the duty ratio of a pulse signal outputted from a pin 340 by changing the capacity of the capacitor 322 in the RC filter circuit 320.

In an embodiment, as described above, the circuit board CB further includes a Hall element 260 that detects the rotational speed of the brushless DC motor 200. The TACH terminal 300 includes a switching element 310 with an open-collector or open-drain output function. The RC filter circuit 320 is electrically connected between the switching element 310 and the output terminal of the Hall element 260.

According to the identification method as described above, an output from the Hall element 260 first passes through the RC filter circuit 320. Thereby, the rise time of the waveform can be delayed. The switching element 310 can amplify the pulse signal with the rise time delayed. In addition, an output from the RC filter circuit 320 can be used as, for example, a signal for switching excitation phases besides the TACH signal.

In an embodiment, as described above, the TACH terminal 300 includes a switching element 310 with an open-collector or open-drain output function, and the RC filter circuit 320 is electrically connected to an open terminal of the switching element 310.

According to the identification method as described above, the TACH signal amplified by the switching element 310 passes through the RC filter circuit 320, whereby the rise time of the waveform can be delayed.

In an embodiment, as described above, the brushless DC motor 200 further includes an MCU 260. The identification method for the brushless DC motor 200 further includes causing the MCU 260 to generate a pulse signal for a preset period after the start of supply of the power supply voltage Vmot to the brushless DC motor 200, the pulse signal having the allocated duty ratio among predetermined duty ratios allocated to the respective types of brushless DC motors and output the generated pulse signal from the TACH terminal 300.

According to the identification method as described above, the pulse signals at the duty ratios allocated to the respective types of brushless DC motor can be outputted from the TACH terminals 300 without rotating the brushless DC motors 200.

In an embodiment, as described above, the identifying a type of the brushless DC motor 200 includes identifying the type of the brushless DC motor to be identified, based on the obtained unique information piece by referring to the table illustrated in FIG. 8, for example, in which multiple types of brushless DC motors are associated with multiple unique information pieces of brushless DC motors, the unique information pieces each allocated to one of the multiple types of brushless DC motors.

According to the identification method as described above, the controller 110 of the identification apparatus 100 can identify the type of the brushless DC motor 200 to be identified based on the obtained unique information piece by referring to the table.

In an embodiment, as described above, the obtaining a unique information piece of the brushless DC motor 200 involves obtaining, as the unique information piece of the brushless DC motor 200, a time difference between the on-time and the off-time in one pulse cycle of the pulses outputted from the TACH terminal 300 of the circuit board CB.

According to the identification method as described above, a type of brushless DC motor can be identified without relying on the number of rotations of the motor.

In an embodiment, as described above, the identification method for the brushless DC motor 200 further includes providing a notification of an identification result of the type of the brushless DC motor.

According to the identification method as described above, for example, the controller 110 of the identification apparatus 100 may once write the identification result to the memory 120 or may transmit the identification result to another apparatus or device needing the identification result as explained above. Instead, it is possible to provide a notification of the identification result of the type of the brushless DC motor 200 by using a display device (for example, a liquid crystal display), a speaker, and so on.

In an embodiment, the identification method for the brushless DC motor 200 further includes: based on the identification result of the type of the brushless DC motor, selecting a LED 130 allocated to the brushless DC motor 200 to be identified from among multiple LEDs 130 allocated to the multiple types of brushless DC motors, and causing the selected LED 130 to emit light.

According to the identification method as described above, for example, a red LED may be allocated for the supplier A, a blue LED may be allocated for the supplier B, and a green LED may be allocated for the supplier C. When identifying the brushless DC motor of the supplier C, the controller 110 of the identification apparatus 100 can cause the green LED to emit light.

In an embodiment, the brushless DC motor 200 is, for example, a DC fan including an impeller.

According to the identification method as described above, it is possible to identify types of brushless DC motors 200 such as an axial fan, a centrifugal fan, a cross-flow fan, and a sirocco fan, for example.

An identification apparatus 100 in an exemplary embodiment of the present disclosure is an identification apparatus that identifies types of brushless DC motors 200. For example, as described with reference to FIGS. 1 and 2, each brushless DC motor 200 includes a circuit board CB on which a TACH terminal 300 for tachometer is mounted. The duty ratios of pulses outputted from the TACH terminals 300 vary among multiple types of brushless DC motors. The identification apparatus 100 includes: a power supply terminal to supply a power supply voltage Vmot to a brushless DC motor 200; an input terminal for tachometer electrically connected to the TACH terminal 300 of the circuit board CB; and a controller 110 that identifies a type of the brushless DC motor 200. The controller 110 acquires pulses outputted from the TACH terminal 300 of the circuit board CB via the input terminal for tachometer when the power supply voltage Vmot is supplied to the brushless DC motor via the power supply terminal, obtains the duty ratio of the pulses as a unique information piece of the brushless DC motor 200, and identifies the type of the brushless DC motor 200 based on the unique information piece of the brushless DC motor 200.

The identification apparatus as described above operates under the setting in which each of types of brushless DC motors 200 is configured to output pulses at an exclusively allocated duty ratio from the TACH terminal 300, and this exclusive allocation enables identification of suppliers, products, or production lots.

A brushless DC motor 200 in an exemplary embodiment of the present disclosure includes: a circuit board CB; a TACH terminal 300 that is mounted on the circuit board CB; a coil 240; and a drive circuit that causes electricity to flow through the coil 240, for example, as described with reference to FIGS. 1 and 2. The duty ratios of pulses outputted from the TACH terminals 300 for a preset identification period after input of the power supply vary among multiple types of brushless DC motors.

With the brushless DC motor as described above, each of types of brushless DC motor 200 is configured to output pulses at an exclusively allocated duty ratio from the TACH terminal 300, and this exclusive allocation enables identification of suppliers, products, or production lots.

Embodiments of the present disclosure may be used in a wide variety of instruments including various fan motors, such for example as personal computers, game devices, cleaners, dryers, washing machines, and refrigerators.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An identification method for use in an identification apparatus that identifies a type of brushless DC motor, wherein
the brushless DC motor includes a circuit board on which a terminal for tachometer is mounted,
the duty ratios of pulses outputted from the terminals for tachometer vary among a plurality of types of brushless DC motors, and
the identification method comprises:
supplying a power supply voltage from the identification apparatus to the brushless DC motor;
inputting a pulse outputted from the terminal for tachometer of the circuit board to the identification apparatus;
obtaining the duty ratio of the pulse as a unique information piece of the brushless DC motor; and
identifying a type of the brushless DC motor based on the unique information piece of the brushless DC motor.

2. The identification method according to claim 1, wherein
the circuit board further includes a terminal to control the number of rotations of the brushless DC motor,
the identification method further comprises giving a rotation control signal from the identification apparatus to the brushless DC motor via the terminal to control the number of rotations, thereby rotating the brushless DC motor at an instructed rotational speed, and
the obtaining a unique information piece of the brushless DC motor involves obtaining the duty ratio of the pulse outputted according to the instructed rotational speed from the terminal for tachometer of the circuit board with a rotation of the brushless DC motor.

3. The identification method according to claim 1, wherein
the terminal for tachometer of the circuit board includes an RC filter circuit including a capacitor, and
the capacities of the capacitors vary among the plurality of types of brushless DC motors.

4. The identification method according to claim 3, wherein
the circuit board further includes a Hall element that detects a rotational speed of the brushless DC motor,
the terminal for tachometer includes a switching element with an open-collector or open-drain output function, and
the RC filter circuit is electrically connected between the switching element and an output terminal of the Hall element.

5. The identification method according to claim 3, wherein
the terminal for tachometer includes a switching element with an open-collector or open-drain output function, and
the RC filter circuit is electrically connected to an open terminal of the switching element.

6. The identification method according to claim 1, wherein
the brushless DC motor further includes a controller, and
the identification method further comprises causing the controller to: generate a pulse for a preset period after the start of supply of the power supply voltage to the brushless DC motor, the pulse signal having the allocated duty ratio among predetermined duty ratios allocated to the respective types of brushless DC motors; and output the generated pulse from the terminal for tachometer.

7. The identification method according to claim 1, wherein
the identifying a type of the brushless DC motor includes identifying the type of the brushless DC motor to be identified, based on the obtained unique information piece by referring to a table in which the plurality of types of brushless DC motors are associated with a plurality of unique information pieces of brushless DC motors, the unique information pieces each allocated to one of the plurality of types of brushless DC motors.

8. The identification method according to claim 1, wherein
the obtaining a unique information piece of the brushless DC motor involves obtaining, as the unique information piece, a time difference between an on-time and an off-time in one pulse cycle of the pulse outputted from the terminal for tachometer of the circuit board.

9. The identification method according to claim 1, wherein the identification apparatus further provides a notification of an identification result of the type of the brushless DC motor.

10. The identification method according to claim 1, further comprising, based an identification result of the type of the brushless DC motor, selecting a light emitter allocated to the brushless DC motor to be identified from among a plurality of light emitters allocated to the plurality of types of brushless DC motors, and causing the selected light emitter to emit light.

11. The identification method according to claim 1, wherein the brushless DC motor is a fan motor including an impeller.

12. An identification apparatus that identifies a type of brushless DC motor, wherein
the brushless DC motor includes a circuit board on which a terminal for tachometer is mounted,
the duty ratios of pulses outputted from the terminals for tachometer vary among a plurality of types of brushless DC motors,
the identification apparatus comprises:
a power supply terminal to supply a power supply voltage to the brushless DC motor;
an input terminal for tachometer electrically connected to the terminal for tachometer of the circuit board; and
a controller that identifies the type of the brushless DC motor,
the controller acquires, via the input terminal for tachometer, a pulse outputted from the terminal for tachometer of the circuit board when the power supply voltage is supplied to the brushless DC motor via the power supply terminal, and
the controller obtains the duty ratio of the pulse as a unique information piece of the brushless DC motor, and identifies the type of the brushless DC motor based on the unique information piece of the brushless DC motor.

13. A brushless DC motor comprising:
a circuit board;
a terminal for tachometer mounted on the circuit board;
a coil; and
a drive circuit that causes electricity to flow through the coil, wherein
the duty ratios of pulses outputted from the terminals for tachometer for a preset identification period after input of power supply vary among a plurality of types of brushless DC motors.

* * * * *